(12) United States Patent
Lee et al.

(10) Patent No.: US 8,999,848 B2
(45) Date of Patent: Apr. 7, 2015

(54) METHOD FOR FORMING FINE PATTERN OF SEMICONDUCTOR DEVICE USING DOUBLE SPACER PATTERNING TECHNOLOGY

(71) Applicant: SK hynix Inc., Icheon (KR)

(72) Inventors: Ki Lyoung Lee, Seoul (KR); Cheol Kyu Bok, Icheon (KR); Won Kyu Kim, Icheon (KR)

(73) Assignee: SK hynix Inc., Icheon (KR)

( * ) Notice: Subject to any disclaimer, the term of this patent is extended or adjusted under 35 U.S.C. 154(b) by 46 days.

(21) Appl. No.: 13/679,518

(22) Filed: Nov. 16, 2012

(65) Prior Publication Data
US 2014/0017889 A1   Jan. 16, 2014

(30) Foreign Application Priority Data
Jul. 12, 2012   (KR) .................. 10-2012-0076220

(51) Int. Cl.
| | | |
|---|---|---|
| *H01L 21/311* | (2006.01) |
| *H01L 21/302* | (2006.01) |
| *H01L 21/306* | (2006.01) |
| *H01L 21/308* | (2006.01) |
| *H01L 21/48* | (2006.01) |
| *H01L 21/28* | (2006.01) |
| *H01L 21/768* | (2006.01) |
| *H01L 27/115* | (2006.01) |

(52) U.S. Cl.
CPC ...... *H01L 21/4846* (2013.01); *H01L 21/28132* (2013.01); *H01L 2924/0002* (2013.01); *H01L 27/11531* (2013.01) 438/736; 257/E21.231; 257/E21.039

(58) Field of Classification Search
USPC ......... 438/703, 642, 694, 696, 700, 702, 716, 438/736; 257/E21.039, E21.231
See application file for complete search history.

(56) References Cited

U.S. PATENT DOCUMENTS

| 8,216,938 | B2 | 7/2012 | Lee et al. | |
|---|---|---|---|---|
| 8,389,400 | B2 * | 3/2013 | Lee et al. | 438/622 |
| 8,835,321 | B2 * | 9/2014 | Ha | 438/696 |
| 2007/0141769 | A1 * | 6/2007 | Lee | 438/197 |
| 2010/0055922 | A1 * | 3/2010 | Kim et al. | 438/745 |
| 2011/0124198 | A1 * | 5/2011 | Lee et al. | 438/735 |
| 2012/0208361 | A1 * | 8/2012 | Ha | 438/597 |

* cited by examiner

*Primary Examiner* — Su C Kim
*Assistant Examiner* — Regan J Rundio

(57) ABSTRACT

A method of forming a fine pattern of a semiconductor device using double SPT process, which is capable of implementing a line and space pattern having a uniform fine line width by applying a double SPT process including a negative SPT process, is provided. The method includes a first SPT process and a second SPT process and the second SPT process includes a Negative SPT process.

8 Claims, 17 Drawing Sheets

(a)

(b)

(a)        (b)

(a)        (b)

METHOD FOR FORMING FINE PATTERN OF SEMICONDUCTOR DEVICE USING DOUBLE SPACER PATTERNING TECHNOLOGY

CROSS-REFERENCES TO RELATED APPLICATION

This application claims priority under 35 U.S.C. 119(a) to Korean application number 10-2012-0076220, filed on Jul. 12, 2012, in the Korean Patent Office, which is incorporated by reference in its entirety.

BACKGROUND OF THE INVENTION

1. Technical Field

The present invention relates to a method of forming a fine pattern of a semiconductor device, and more particularly, to a method of forming a fine pattern of a semiconductor device using double spacer patterning technology.

2. Related Art

With reduction in a design rule of a semiconductor device, it is difficult to form a line/space pattern of 38 nm or less through a conventional exposure method using ArF immersion exposure equipment that employs a numerical aperture (NA) of 1.35 or less. An exposure source (extreme ultraviolet (EUV) having a wavelength of 13.4 nm) has been used to develop a pattern of 30 nm or less. However, it is difficult to apply the EUV process at a production level due to various limitations in exposure source power, mechanism, reticle, lack of resist, and the like.

Therefore, spacer patterning technology (STP) has been applied to form an isolation layer, a control gate (CGT), and a metal layer (MT1 layer) of 20 to 30 nm-graded NAND flash memories, in which line/space patterns of a cell area are mainly formed, and to form an isolation layer (6F2 structure) of 30 nm-graded DRAMs. Application of double patterning technology (DPT) to a process of forming a complicated bit line (BL) core in DRAMs in which various patterns are mixed has also been considered.

Further, as a gate electrode such as a conventional recess gate or a conventional fin-gate, which includes a stacked structure of silicon oxynitride, polysilicon, tungsten (SiON/poly-Si/W), is formed on an active region and as a gate electrode material is in direct contact with a gate dielectric layer, polysilicon having a work function of about 4.1 eV is employed. Meanwhile, for a buried gate structure, a direct metal gate type of a stacked structure including silicon oxynitride, titanium nitride, tungsten (SiON/TiN/W) is employed. For the titanium nitride, a material having a work function of about 4.5 eV is used.

In the buried gate structure, since the gate electrode is buried below a silicon surface, a probability of self-aligned contact (SAC) fail related to a word line (gate) is low and a word line is formed separate from a bit line and thus parasitic capacitance can be reduced. Therefore, a unit cell size can be reduced and thus a net die is increased.

There is a need for methods for reducing a width of the buried gate to increase an integration level of the device having the buried gate structure.

SUMMARY

One or more exemplary embodiments are directed to a method of forming a fine pattern of a semiconductor device using a double SPT process. A method according to an embodiment of the present invention is capable of implementing a line/space pattern having a fine and uniform line width.

According to one aspect of an exemplary embodiment, there is a provided a method of forming a fine pattern of a semiconductor device. The method may include: forming a second layer over a first layer; forming a partition pattern over the second layer; forming first spacers over sidewalls of the partition pattern; removing the partition pattern; etching the second layer using the first spacers as an etch mask to form a first pattern; forming second spacers over sidewalls of the first pattern; forming a gap-fill layer filling between the second spacers; removing the second spacers; and etching the first layer using the first pattern and the gap-fill layer as an etch mask to form a second pattern.

The forming the partition pattern includes: forming a hard mask layer over the second layer; forming a photoresist pattern over the hard mask layer; and etching the hard mask layer using the photoresist pattern as an etch mask.

The forming the hard mask layer includes sequentially forming an amorphous carbon layer and a silicon oxynitride layer over the second layer.

The photoresist pattern has a line-to-space width ratio of 3:5.

A width of the space of the photoresist pattern is four times larger than a width of the second pattern.

The second layer and the gap-fill layer are formed of the same material.

The second layer and the gap-fill layer each include polysilicon.

The etching the second layer using the first spacers as the etch mask to form the first pattern includes etching the first layer to the same thickness as the second spacers.

The forming the second spacers includes forming spacer oxide layers over the second layer.

The forming a gap-fill layer includes: filling a polysilicon layer between the spacer oxide layers; and performing a planarization process on the polysilicon layer and the spacer oxide layers to expose the first pattern.

The forming the second pattern further includes cutting a U-shaped edge of the first pattern to form the first pattern in a line shape.

According to another aspect of an exemplary embodiment, there is a provided a method of forming a fine pattern of a semiconductor device. The method may include: forming a second layer over a first layer; forming a partition pattern over the second layer; forming first spacers over sidewalls of the partition pattern; forming a first gap-fill layer filling between the first spacers; removing the first spacers; etching the second layer using the partition pattern and the first gap-fill layer as an etch mask to form a first pattern; forming second spacers over sidewalls of the first pattern; forming a second gap-fill layer filling between the second spacers; removing the second spacers; and etching the first layer using the first pattern and the second gap-fill layer as an etch mask to form a second pattern.

The forming the partition pattern includes: forming a hard mask layer over the second layer; forming a photoresist pattern over the hard mask layer; and etching the hard mask layer using the photoresist pattern as an etch mask.

The photoresist pattern has a line-to-space width ratio of 1:7.

A width of the space of the photoresist pattern is four times larger than a width of the second pattern.

The first spacers are formed so that a width between the first spacers is substantially the same as a width of the partition pattern.

The partition pattern and the first gap-fill layer are formed of the same material.

The first layer and the second gap-fill layer are formed of the same material.

The partition pattern, the first gap-fill layer, the first layer, and the second gap-fill layer are formed of the same material.

The partition pattern, the first gap-fill layer, the first layer, and the second gap-fill layer each include polysilicon.

The forming the second pattern includes cutting a U-shaped edge of the first pattern to form the first pattern in a line shape.

According to another aspect of an exemplary embodiment, there is a provided a method of forming a fine pattern of a semiconductor device. The method may include: providing a first underlying layer over a target layer; forming spacers over the first underlying layer using positive spacer patterning technique (SPT); patterning the first underlying layer using the spacers as an etching mask to form first mask patterns; forming a second mask pattern between the neighboring first mask patterns using negative SPT; and patterning the target layer using the first and the second mask patterns to form a target pattern.

A minimum pattern width obtainable under a given photolithography process condition is T, and wherein the pattern width of the target pattern is T/4.

A minimum pattern width obtainable under a given photolithography process condition is T, and wherein a distance between the neighboring first mask patterns is T/2, and wherein a distance between the first mask pattern and the second mask pattern is T/4.

The step of forming the spacers over the first underlying layer using the positive SPT includes: providing a first sacrificial pattern over the first underlying layer; forming a first spacer at a sidewall the first sacrificial pattern; and removing the first sacrificial pattern.

The step of forming the second mask pattern between the neighboring first mask patterns using the negative SPT includes: forming a second spacer at a sidewall the first mask pattern; filling a space between neighboring second spacers with a gap-fill material to form the second mask pattern; and removing the second spacer between the first and the second mask patterns.

The target pattern is a trench formed in a substrate.

The method further includes the forming a buried gate in the trench.

The buried gate includes an active gate and a dummy gate, wherein the active gate and the dummy gate are arranged in parallel, and wherein one dummy gate is formed every two active gates.

According to another aspect of an exemplary embodiment, there is a provided a method of forming a fine pattern of a semiconductor device. The method may include: providing a first underlying layer over a target layer providing first sacrificial patterns over the first underlying layer; forming first mask patterns between the first sacrificial patterns using first negative SPT; forming a second mask pattern between the first mask patterns using second negative SPT; and patterning the target layer using the first and the second mask patterns as an etch mask to form a target pattern.

The step of forming the first mask patterns between the first sacrificial patterns using the first negative SPT includes: forming a first spacer at a sidewall of each of the first sacrificial patterns to produce a first space between the first sacrificial patterns; filling the first space with a first gap-fill material to form a second sacrificial pattern; removing the first spacer between the first and the second sacrificial patterns; patterning the first underlying layer to form the first mask pattern.

The step of forming the second mask pattern between the first mask patterns using the second negative SPT includes: forming a second spacer at a sidewall of each of the first and the second sacrificial patterns to produce a second space between the first and the second sacrificial patterns; filling the second space with a second gap-fill material to form the second mask pattern; and removing the second spacer between the first and the second mask patterns.

A minimum pattern width obtainable under a given photolithography process condition is T, and wherein the pattern width of the target pattern is T/4.

A minimum pattern width obtainable under a given photolithography process condition is T, and wherein a distance between the neighboring first mask patterns is T/2, and wherein a distance between the first mask pattern and the second mask pattern is T/4.

These and other features, aspects, and embodiments are described below in the section entitled "DETAILED DESCRIPTION."

BRIEF DESCRIPTION OF THE DRAWINGS

The above and other aspects, features and other advantages of the subject matter of the present disclosure will be more clearly understood from the following detailed description taken in conjunction with the accompanying drawings.

DETAILED DESCRIPTION

Figure 1A:
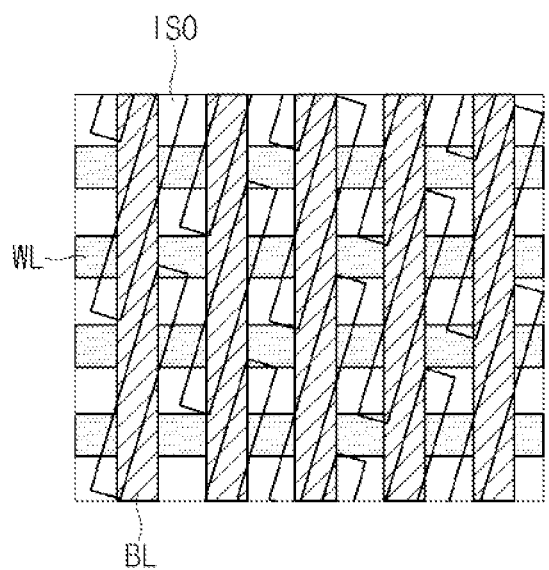
FIGS. 1A and 1B are views illustrating isolation structures according to exemplary embodiments of the present invention.

Hereinafter, exemplary embodiments will be described in greater detail with reference to the accompanying drawings.

Exemplary embodiments are described herein with reference to the drawings, which are illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Hereinafter, a method of forming a fine pattern in a semiconductor device using double spacer patterning technology according to an exemplary embodiment will be described with reference to the accompanying drawings.

To form a buried gate having a pitch of 20 to 37 nm for a 10 to 20 nm DRAM 6F2 layout, a method can be used that implements, for example (1) a double SPT method using an ArF light source and (2) a single SPT using extreme ultraviolet (EUV). In an embodiment, the double SPT process may form a fine pattern having a width of 20 to 37 nm without employing EUV equipment.

Conventionally, an active region is an island type. In a conventional method of forming a 40 nm DRAM with a 6F2 layout, the active region is formed by applying a single patterning process. In a conventional method of forming a 30 nm DRAM with a 6F2 layout, the active region is formed by performing a positive SPT process and then a separate process of patterning a contact hole to separate the lines.

However, to form a 20 nm device with a 6F2 layout, ensuring an area of the active region is one of the most important issues. If the conventional island type active region is applied, an active region is formed by a line/space patterning method Thus, the active region is formed in a line shape.

Figure 1B:
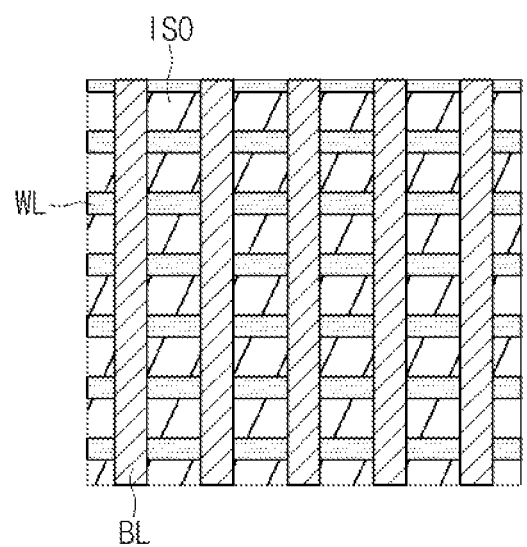

FIGS. 1A and 1B are illustrate isolation structures according to exemplary embodiments, wherein FIG. 1A illustrates an isolation structure defining island type active regions and FIG. 1B illustrates a line type isolation structure. As shown in FIGS. 1A and 1B, the active region extends along a direction that crosses the bit line (BL) at an acute angle. When the line type isolation structure is applied, an angle of an active region is slightly different compared to the island type active region, illustrated in FIG. 1A. Further, a width of the island type active region is relatively larger to ensure the area of the active region. However, a width of a buried gate (BG) is reduced, and thus patterning the buried gate becomes more difficult.

In the line type isolation structure illustrated in FIG. 1B, an isolation gate is formed and a voltage is applied to the isolation gate to separate neighboring active regions. The isolation gate (also referred to as a dummy gate) is formed every two buried gates (also referred to as an active gate or a real gate) so that two active buried gates pass through each active region.

Figure 2:
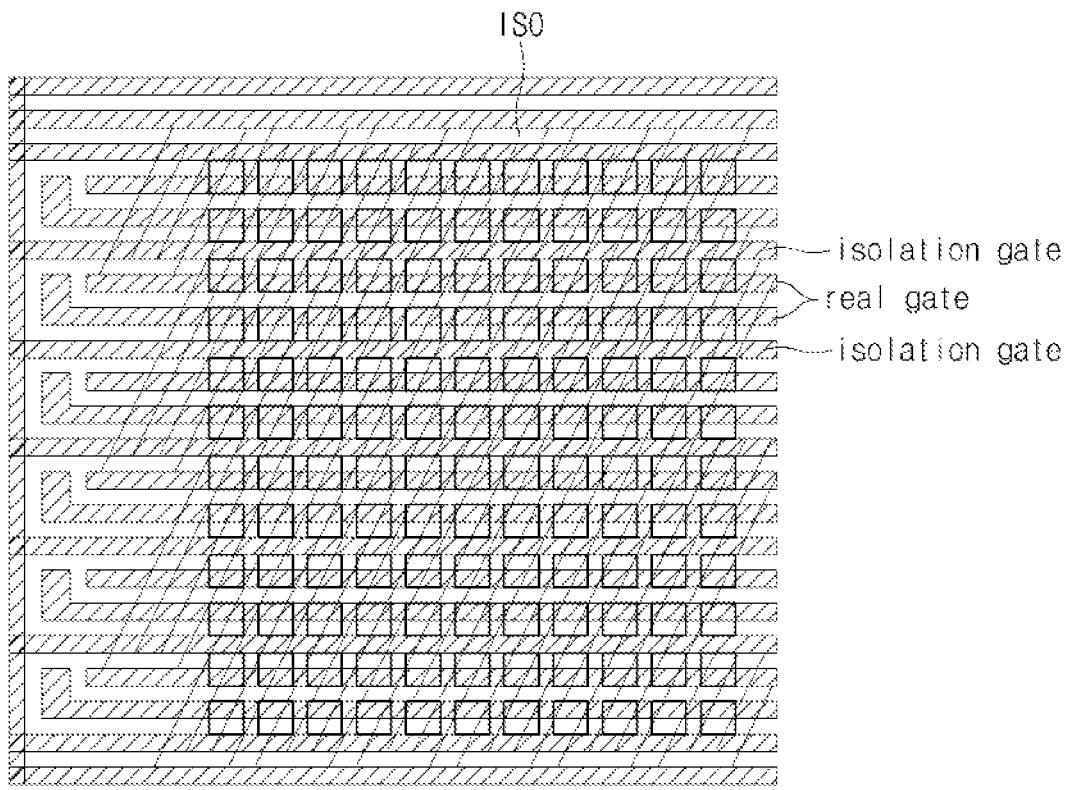
FIG. 2 is a view illustrating a gate in the isolation structure illustrated in FIG. 1A.

FIG. 2 illustrates a layout of a buried gate when the line type isolation structure illustrated in FIG. 1B is applied. Referring to FIG. 2, the buried gates may be formed using SPT. However, SPT has disadvantages compared with a single exposure process.

The most typical limitation of an SPT process is that it connects all isolation gates (BG) to each other. Since it is impossible to form a separate contact for individual buried gates (BG), in an embodiment of the present invention, the isolation gates are connected to each other through contacts which are arranged at every three buried gates.

However, it is relatively difficult to form a pad at an end of the buried gate and thus a padless scheme has been developed. Therefore, the bit lines are connected by applying a separate contact mask and then the active regions are separated.

In the process for forming the buried gate, since the gate electrode is buried below a silicon (substrate) surface, uniformity of space size is relatively more important than uniformity of line size. A negative SPT process is more advantageous than a positive SPT process in ensuring the uniformity of space size (see FIGS. 3A to 3D).

Figure 3A:
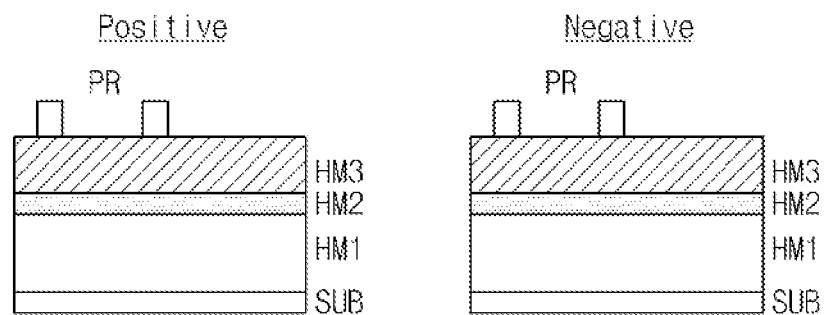
FIGS. 3A to 3D are schematics views illustrating positive spacer patterning technology (SPT) and negative SPT.
Figure 3B:
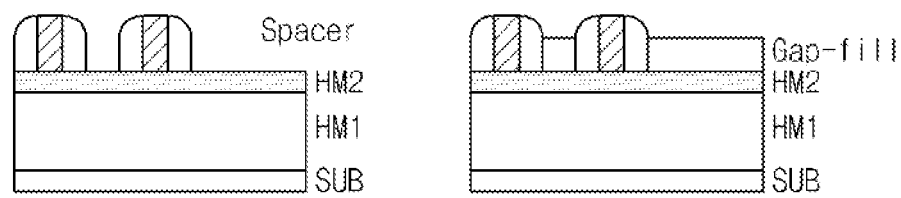
Figure 3C:
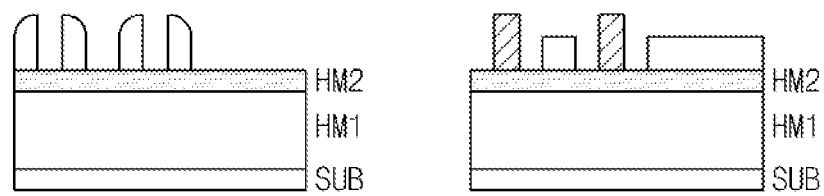
Figure 3D:
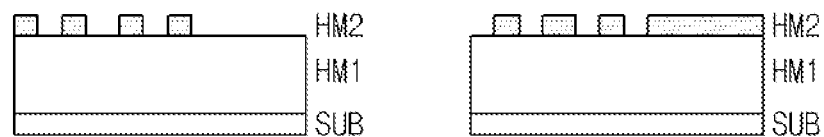

Hereinafter, a positive SPT process and a negative SPT process in accordance with an embodiment of the present invention will be described with reference to FIGS. 3A to 3D. In FIGS. 3A to 3D, the drawings on the left of the figures illustrate the positive STP process and the drawings on the right of the figures illustrate negative SPT process. In both the positive SPT process and the negative SPT process, multiple hard mask layers HM1, HM2, and HM3 are formed on a substrate SUB and a photoresist pattern PR is formed on the hard mask layer HM3 (FIG. 3A). A ratio of a line width of a line to a line width of a space between lines in the photoresist pattern PR may be 1:3. The third hard mask layer HM3 is patterned using the photoresist pattern PR to form a third hard mask pattern.

Subsequently, in the positive SPT process, spacers are formed on sidewalls of the third hard mask pattern. In the positive SPT process, the third hard mask pattern is removed, and then the second hard mask layers HM2 is etched using the spacers as an etch mask to form a second hard mask pattern.

In the negative SPT process, after spacers are formed on sidewalls of the third hard mask pattern, a gap-fill material is filled between the spacers. The spacers are removed, and then the second hard mask layer HM2 is etched using remaining patterns as an etch mask. As a result, a second hard mask pattern is formed.

The double SPT method in an exemplary embodiment includes a first SPT process and a second SPT process, which may be any of four possible schemes. That is the double SPT method may include a (1) Positive SPT/Positive SPT, (2) Positive SPT/Negative SPT, (3) Negative SPT/Positive SPT, or (4) Negative SPT/Negative SPT. Since the negative SPT method is more advantageous than the positive SPT method in ensuring uniformity of the space size, it is preferred to employ (2) Positive/Negative scheme or (4) Negative/Negative scheme so that the second SPT is a negative SPT.

Therefore, to form a 10 to 20 nm-sized buried gate in a 20 to 37 nm DRAM 6F2 layout, a method of implementing a double SPT of (2) Positive/Negative scheme and (4) Negative/Negative scheme is suggested in the present invention as preferred embodiments.

Hereinafter, a method of forming a fine pattern of a semiconductor device according to a first exemplary embodiment will be described with reference to FIGS. 4A to 4L and a method of forming a fine pattern in a semiconductor device according to a second exemplary embodiment will be described with reference to FIGS. 5A to 5O. In FIGS. 4A to 4L and FIGS. 5A to 5O, (a) shows a cross-sectional view and (b) shows a plan view, wherein (a) corresponds to a cross-sectional view taken along a line A-A'. A cell area and a peripheral circuit area are included in the plan view illustrated in (b) of FIGS. 4A to 4L and FIGS. 5A to 5O, wherein a right portion is the cell area in which line and space patterns are formed and a left portion is a peripheral circuit area.

Figure 4A:
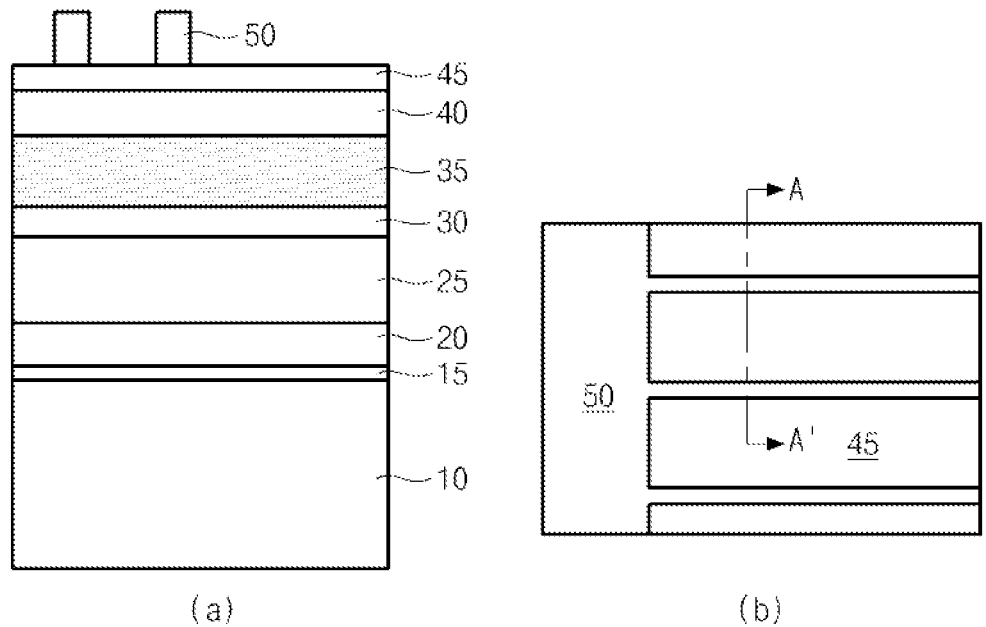
FIGS. 4A to 4L are views illustrating a method of forming a fine pattern of a semiconductor device according to a first exemplary embodiment of the present invention.

First, referring to FIG. 4A, a pad oxide layer 15, a pad nitride layer 20, a first amorphous carbon layer 25, a first silicon oxynitride (SiON) layer 30, a polysilicon layer 35, a second amorphous silicon layer 40, and a second silicon oxynitride layer 45 are sequentially formed on a target layer 10. Here, the second amorphous carbon layer 40 serves as a partition pattern in a subsequent SPT process. The silicon oxynitride layers 30 and 45 are formed on the amorphous carbon layers 25 and 40, respectively. Since the silicon oxynitride layers 30 and 45 are deposited at a high temperature of about 400° C., the amorphous carbon layers 25 and 40 may include high temperature spin on carbon (SOC). Typically, the target layer 10 may be a silicon substrate, but is not limited thereto.

A photoresist layer pattern 50 is formed on the second silicon oxynitride layer 45 so that the ratio of a line width of a line to a line width of a space between lines is 3:5. The photoresist layer pattern 50 is formed so that the space has the linewidth four times a linewidth of a target pattern. For example, when the width of the target pattern is 16 nm, a linewidth of the photoresist layer pattern is set to about 48 nm and a linewidth of a space (i.e., a spatial linewidth between the photoresist layer patterns) is set to about 80 nm. Although not shown, an antireflection coating (ARC) layer may be additionally formed below the photoresist layer pattern 50.

Figure 4B:
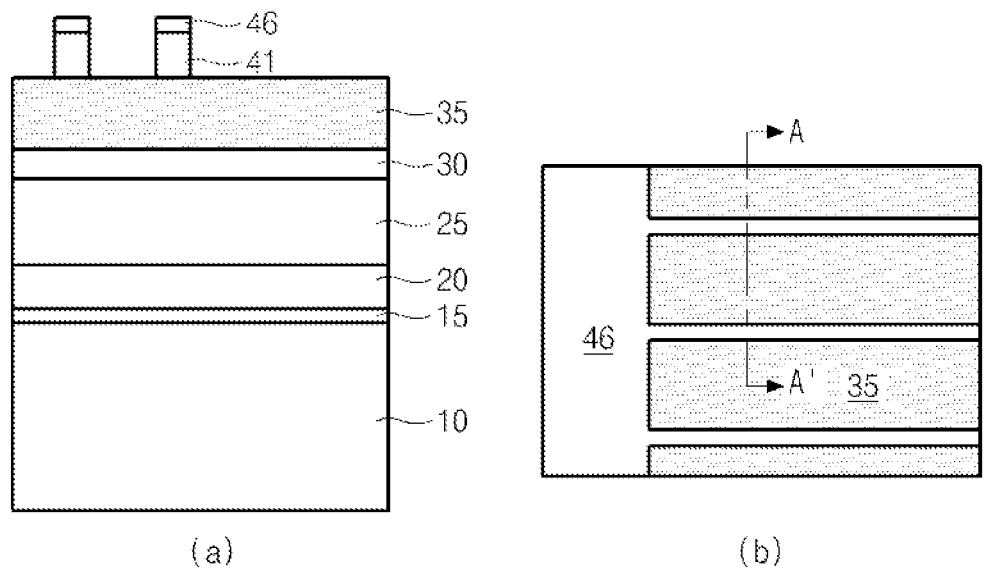

Referring to FIG. 4B, the second silicon oxynitride layer 45 is etched using the photoresist layer pattern 50 as an etch mask to form a second oxynitride layer pattern 46. The second amorphous carbon layer 40 is etched using the remaining photoresist layer pattern 50 and second silicon oxynitride layer pattern 46 as an etch mask to form a second amorphous carbon layer pattern 41 (also referred to as a sacrificial pattern). The remaining photoresist layer pattern 50 is removed.

Figure 4C:
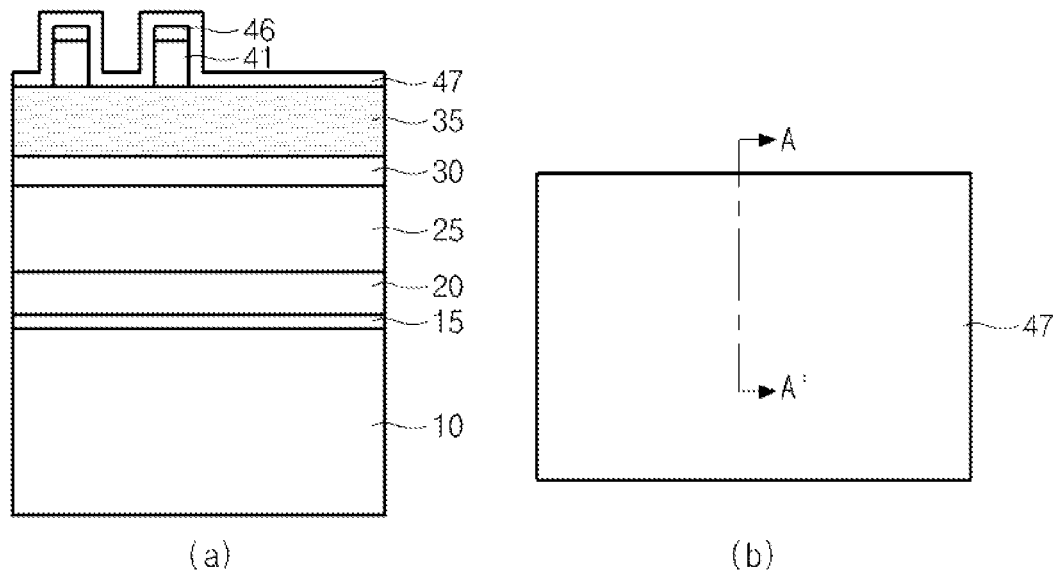

Referring to FIG. 4C, a spacer oxide layer 47 is formed to have a predetermined thickness on the polysilicon layer 35, the second amorphous carbon layer pattern 41, and the second silicon oxynitride layer pattern 46. The spacer oxide layer 47 may have good step coverage and be formed using an atomic layer deposition (ALD) method.

Figure 4D:
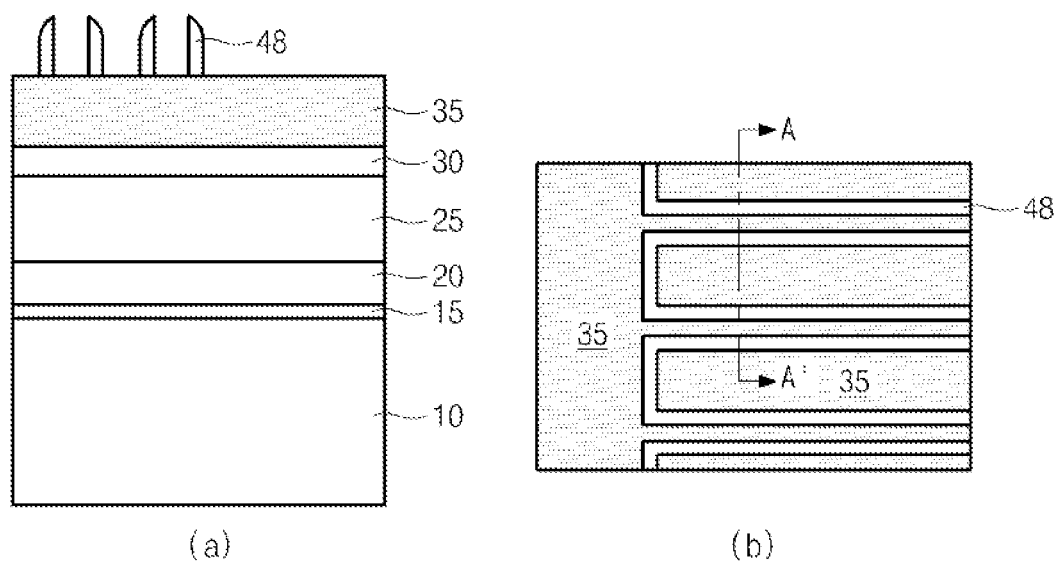

Referring to FIG. 4D, an etch back process is performed on the spacer oxide layer 47 to form spacers 48 which remain only sidewalls of the second amorphous carbon layer pattern 41 and the second silicon oxynitride layer pattern 46. Then the second amorphous carbon layer pattern 41 and the second silicon oxynitride layer pattern 46 are removed.

Figure 4E:
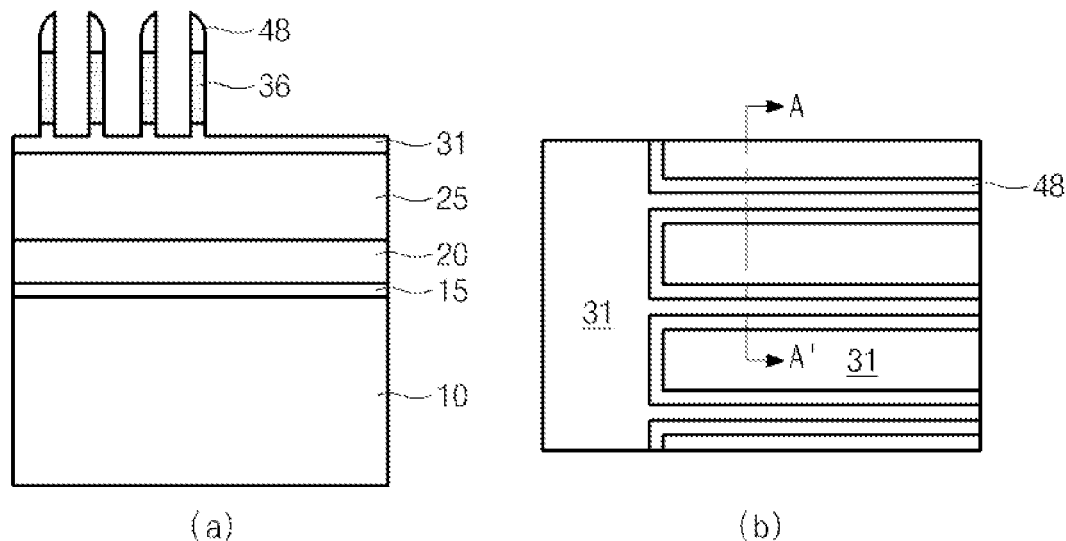

Referring to FIG. 4E, the polysilicon layer 35 and a portion of the first silicon oxynitride layer 30 are etched using the spacer 48 as an etch mask to form a polysilicon pattern 36 and a first silicon oxynitride layer pattern 31. The silicon oxynitride layer 30 may be etched to have substantially the same thickness as that of a spacer oxide layer which will be formed in the subsequent process.

Figure 4F:
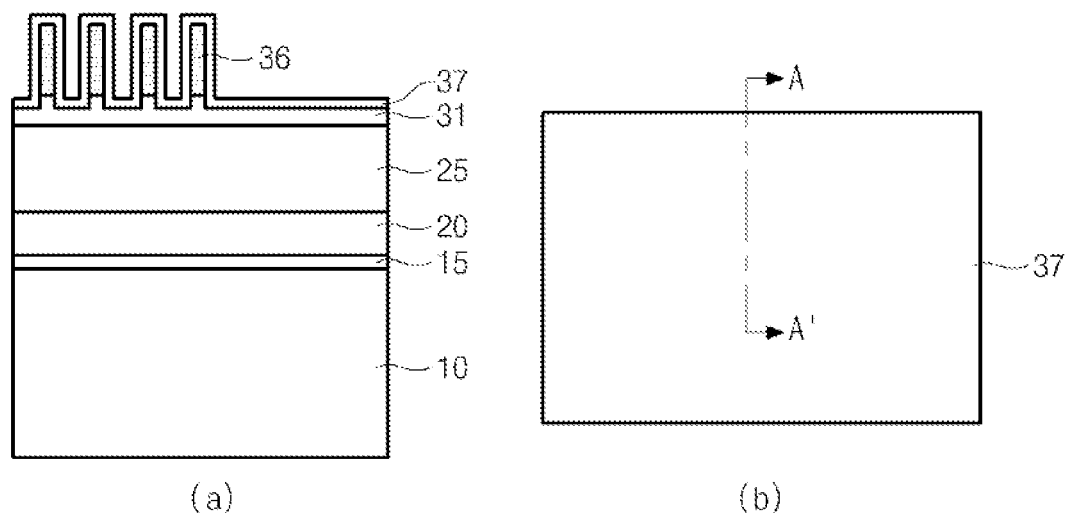

Referring to FIG. 4F, the remaining spacers 48 are removed using an etch process such as an oxide wet strip process. In an embodiment, the remaining spacers 48 may be removed using a HF-based wet etching compound. A spacer oxide layer 37 is formed to have a predetermined thickness on the first silicon oxynitride layer pattern 31 and the polysilicon pattern 36. The spacer oxide layer 37 may be used in the (2) Negative SPT process. The spacer oxide layer may have good step coverage and may be formed using an ALD method.

Figure 4G:
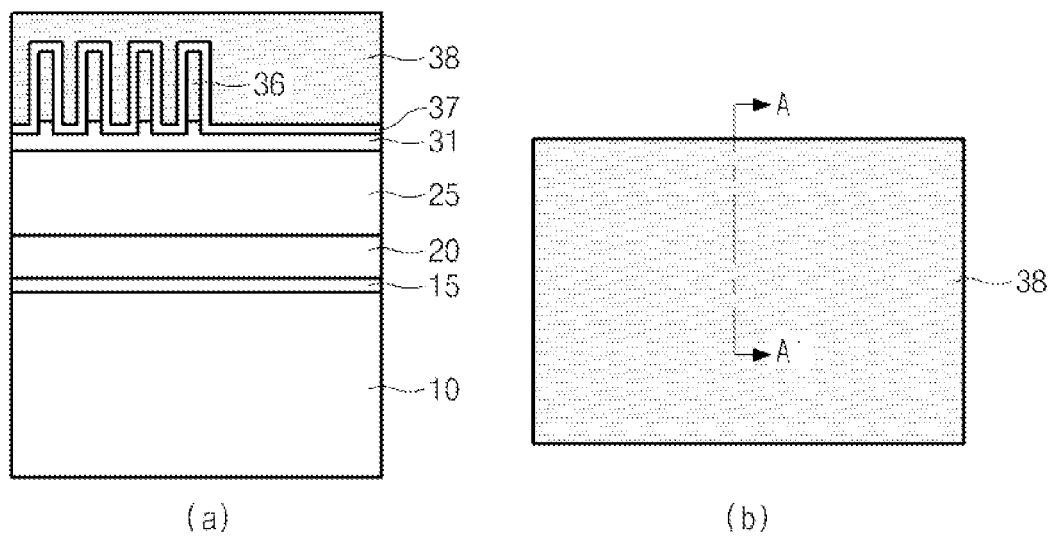

Referring to FIG. 4G, a gap-fill layer 38 is formed on an entire surface in which the spacer oxide layer 37 is formed. The gap-fill layer 38 is then entirely planarized. The gap-fill layer 38 may include polysilicon.

Figure 4H:
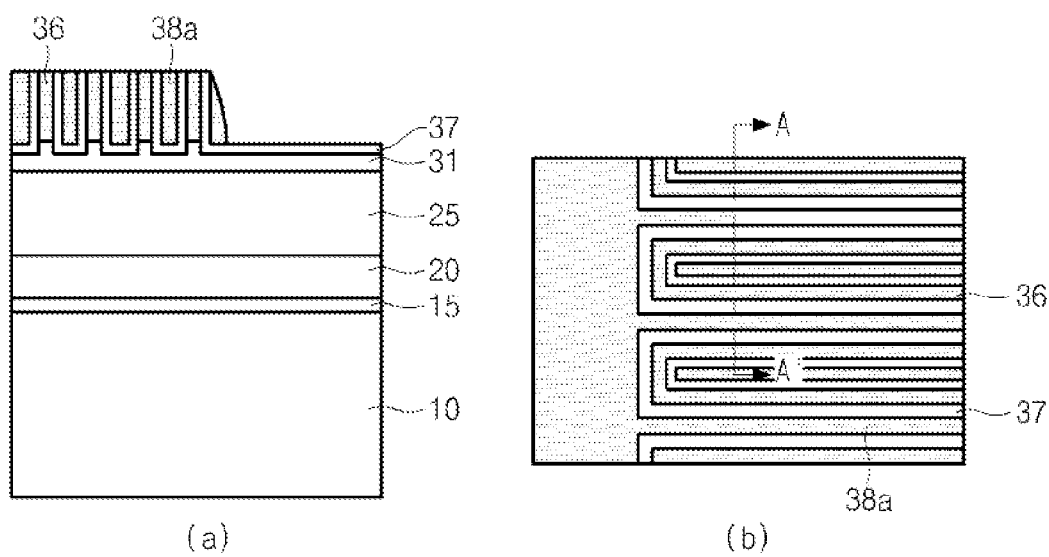

Referring to FIG. 4H, an etch back process is performed on the gap-fill layer 38 to form a gap-fill layer pattern 38a, which remains only on the spacer oxide layer 37 between the polysilicon patterns 36 and on a sidewall of the spacer oxide layer 37. The etch back process on the gap-fill layer 38 may include a dry etch back process, a chemical mechanical polishing (CMP) process, or a wet strip process. In the etch back process, the spacer oxide layer 37 on the polysilicon patterns 36 is removed to expose upper surfaces of the polysilicon patterns 36.

Figure 4I:
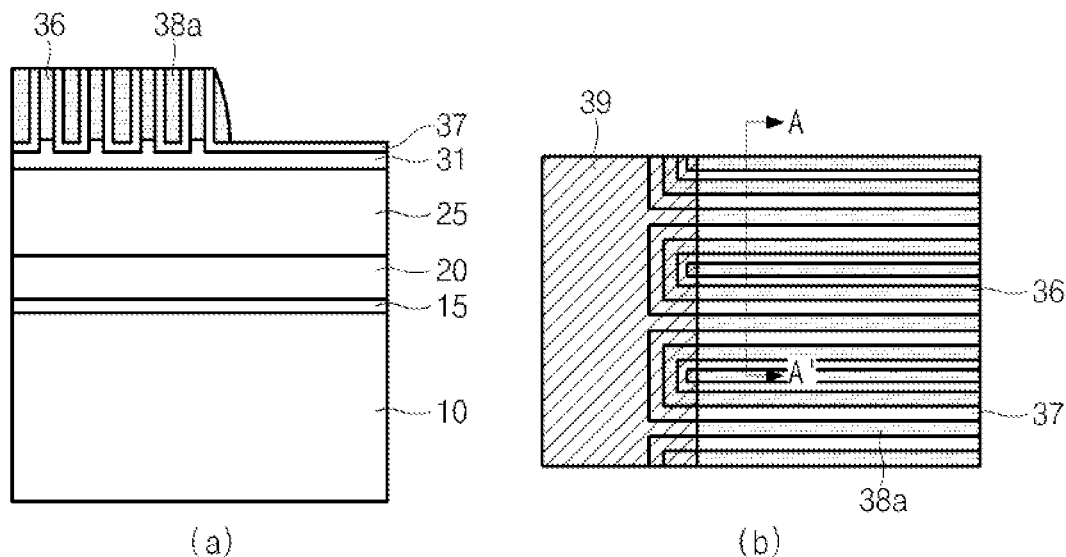

Referring to FIG. 4I, a pad mask 39 is formed on an end portion of the cell area and on the peripheral circuit area. The pad mask 39 may serve as a protection layer which prevents the gap-fill pattern 38a in the peripheral circuit area from being etched in a subsequent process.

Figure 4J:
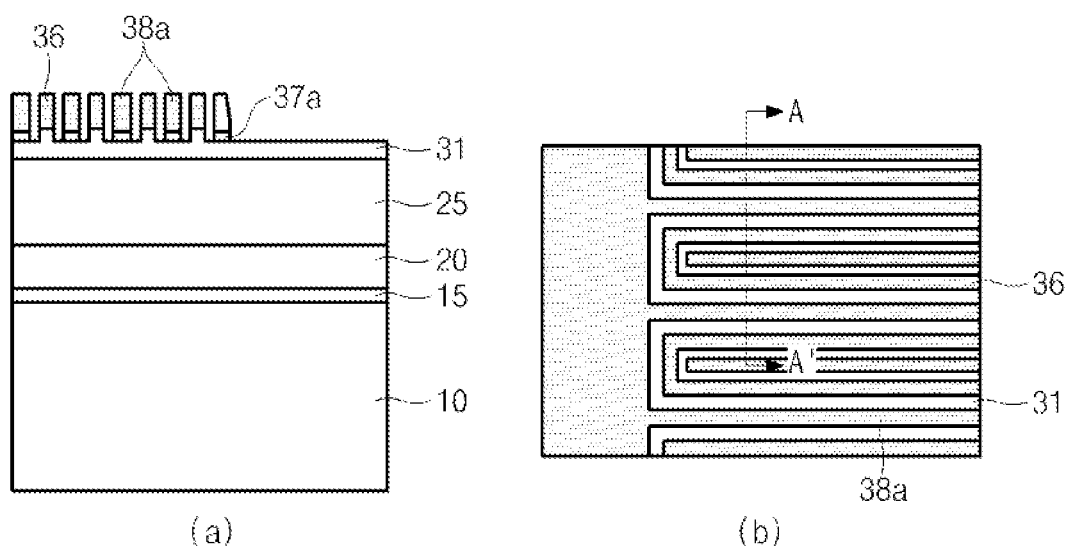

Referring to FIG. 4J, the spacer oxide layer 37 between the polysilicon pattern 36 and the gap-fill layer pattern 38a is removed through an anisotropic etching process such as an etch back process using different etch selectivities among the polysilicon pattern 36, the spacer oxide layer 37, and the gap-fill layer pattern 38a. Therefore, the polysilicon pattern 36 and the gap-fill patterns 38a formed of polysilicon form line and space patterns in which the polysilicon pattern 36 and the gap-fill layer patterns 38a formed of polysilicon are formed at a given fine interval. Since the first silicon oxynitride layer 30 has been previously etched to a predetermined depth in the previous process, a thickness of a stack of the first oxynitride layer pattern 31 and the polysilicon layer pattern 36 is the same as a thickness of a stack of the remaining spacer oxide layer 37a and gap-fill layer patterns 38a. Subsequently, the pad oxide layer 39 is removed and then a cleaning process is performed.

Figure 4K:
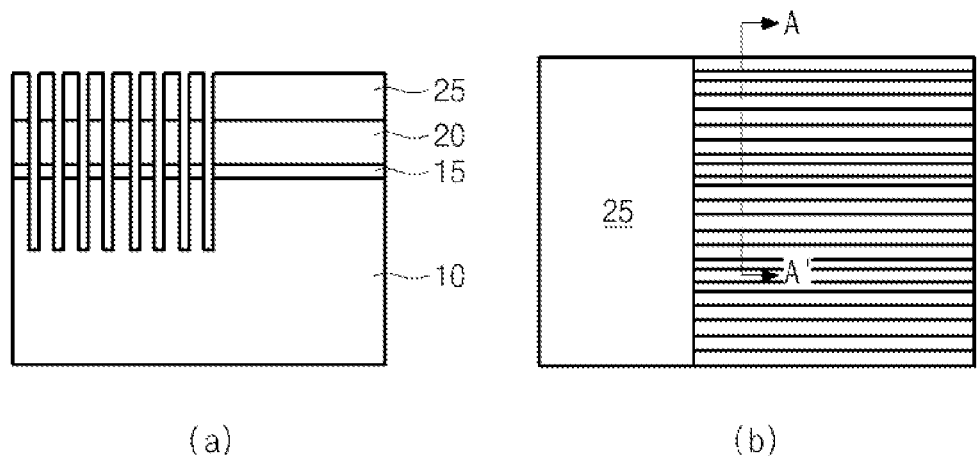

Referring to FIG. 4K, a pad mask (not shown) opening the peripheral circuit area and the end portion of the cell area, that is, a mask opening a region in which the pad mask 39 is removed, is formed. The gap-fill layer pattern 38a, the spacer oxide layer 37, and the first silicon oxynitride layer pattern 31 are etched using the mask to cut U-shaped patterns formed by the SPT process.

The pad mask (not shown) opening the peripheral circuit area and the first side of the cell area is removed, a pad mask (not shown) opening the U-shaped patterns is formed. Next, the underlying layers are sequentially etched using the polysilicon pattern 36 and the gap-fill pattern 38a as an etch mask. That is, the first oxynitride layer pattern 31, the first amorphous carbon layer 25, the pad nitride layer 20, the pad oxide layer 15, and the target layer 10 are sequentially etched. The first amorphous carbon layer 25 is used as a final hard mask. This is because the amorphous carbon layer 25 is a material capable of simultaneously allowing silicon in the active region and oxide in the isolation region to be etched while protecting a hard mask nitride layer (not shown) of the buried gate.

Figure 4L:
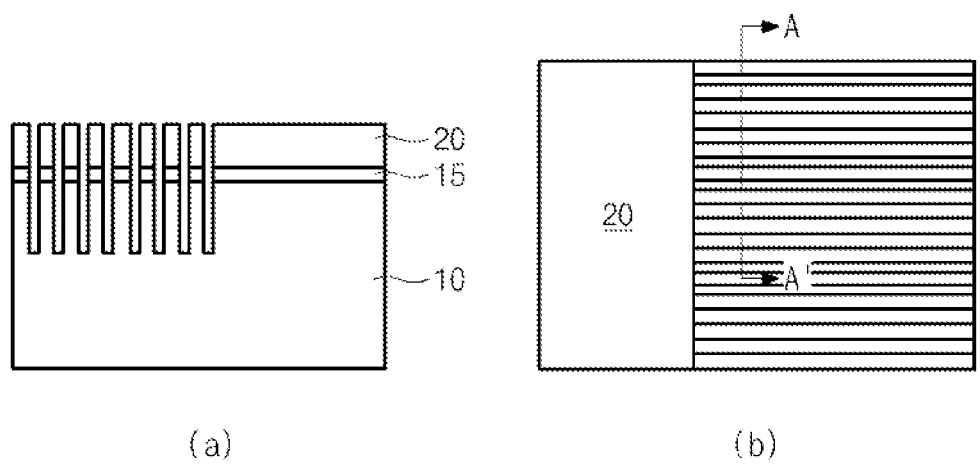

Referring to FIG. 4L, the amorphous carbon layer 25 used as the hard mask is removed.

In the method of forming a fine pattern of a semiconductor device according to the above-described first exemplary embodiment, the double SPT including the positive SPT and the negative SPT is applied to implement line and space patterns having a uniform fine line width.

Figure 5A:
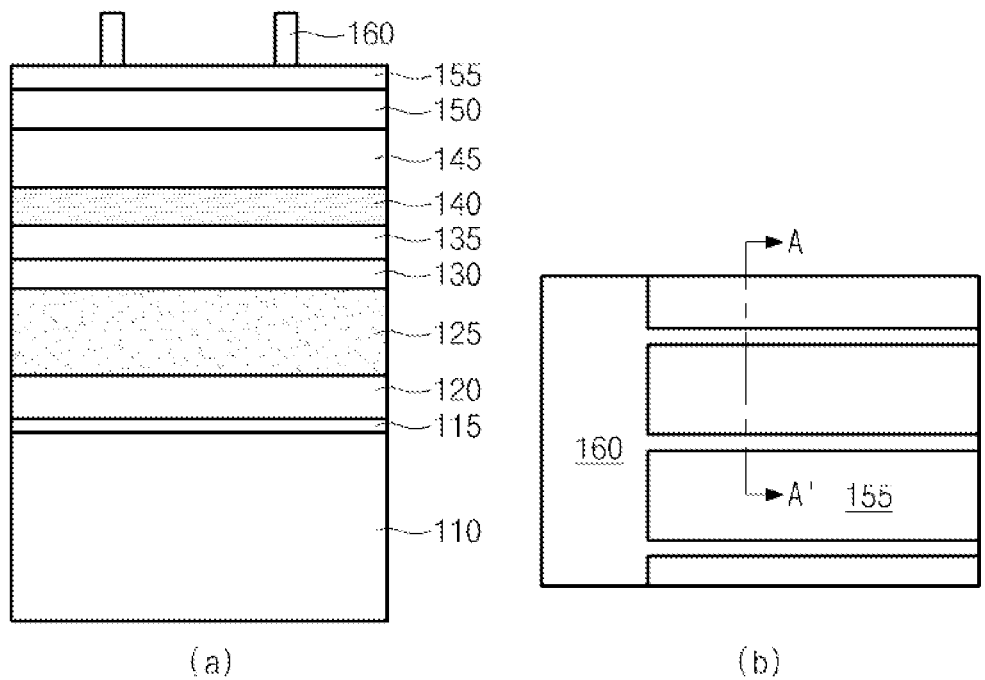
FIGS. 5A to 5O are views illustrating a method of forming a fine pattern of a semiconductor device according to a second exemplary embodiment of the present invention.

FIGS. 5A to 5O illustrate a method of forming a fine pattern of a semiconductor device according to a second exemplary embodiment. In FIGS. 5A to 5O, (a) shows a cross-sectional view and (b) shows a plan view, wherein (a) corresponds to a cross-sectional view taken along a line A-A'. A cell area and a peripheral circuit area are included in the plan view illustrated in (b) of FIGS. 5A to 5O, wherein a right portion in which line and space patterns are formed is the cell area and a left portion in which the line and space patterns are not formed is a peripheral circuit area.

First, referring to FIG. 5A, a pad oxide layer 115, a pad nitride layer 120, a first amorphous carbon layer 125, a first silicon oxynitride (SiON) layer 130, a first polysilicon layer 135, a plasma enhanced-tetraethyl orthosilicate (PE-TEOS) layer 140, a second polysilicon layer 145, a second amorphous silicon layer 150, and a second silicon oxynitride layer 155 are sequentially formed on a target layer 110. The oxynitride layers 130 and 155 are formed on the amorphous silicon layers 125 and 150, respectively. Since the silicon oxynitride layers 135 and 150 are deposited at a high temperature of about 400° C., the amorphous carbon layers 125 and 150 may include high temperature spin on carbon (SOC). Typically, the target layer, i.e., the layer to be etched 100, may be a silicon substrate, but not limited thereto.

A photoresist layer pattern 160 is formed on the second silicon oxynitride layer 155 so that the ratio of a line width of a line to a line width of a space between lines is 1:7. The photoresist layer pattern 160 is formed so that the space has the line width four times a line width of a target pattern. For example, when a target pattern size is 16 nm, a line width of the photoresist layer pattern is 16 nm and a line width of a space between the photoresist layer patterns is 112 nm.

Although not shown, an antireflection coating (ARC) layer may be additionally formed below the photoresist layer pattern 160.

Figure 5B:
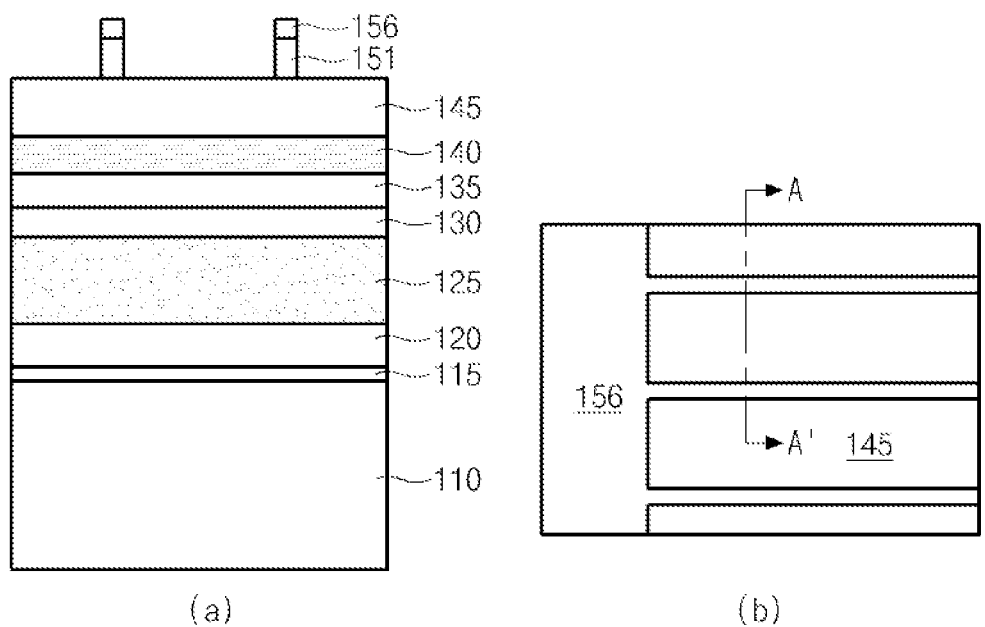

Referring to FIG. 5B, the second silicon oxynitride layer 155 is etched using the photoresist layer pattern 160 as an etch mask to form a second oxynitride layer pattern 156. The second amorphous carbon layer 150 is etched using the remaining photoresist layer pattern 160 and second silicon oxynitride layer pattern 156 as an etch mask to form a second amorphous carbon layer pattern 151. The remaining photoresist layer pattern 160 is removed.

Figure 5C:
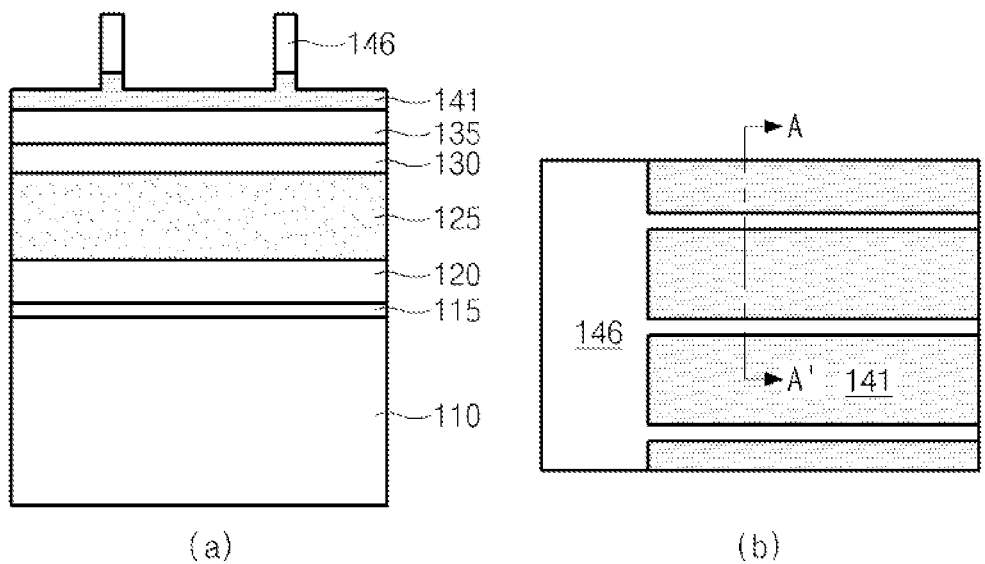

Referring to FIG. 5C, the second polysilicon layer 145 is etched using the second silicon oxynitride layer pattern 156 and the second amorphous carbon layer pattern 151 as an etch mask to form a second polysilicon pattern 146. Then the underlying PE-TEOS layer 140 is additionally etched to a predetermined thickness to form a PE-TEOS pattern 141. Forming the PE-TEOS pattern 141 is performed to maintain the heights and etch selectivities of partition patterns in the negative SPT process. Thus the PE-TEOS layer 140 may have an etch selectivity similar to a spacer oxide layer (see 147 of FIG. 5D), and is formed below the second polysilicon pattern 146.

Figure 5D:
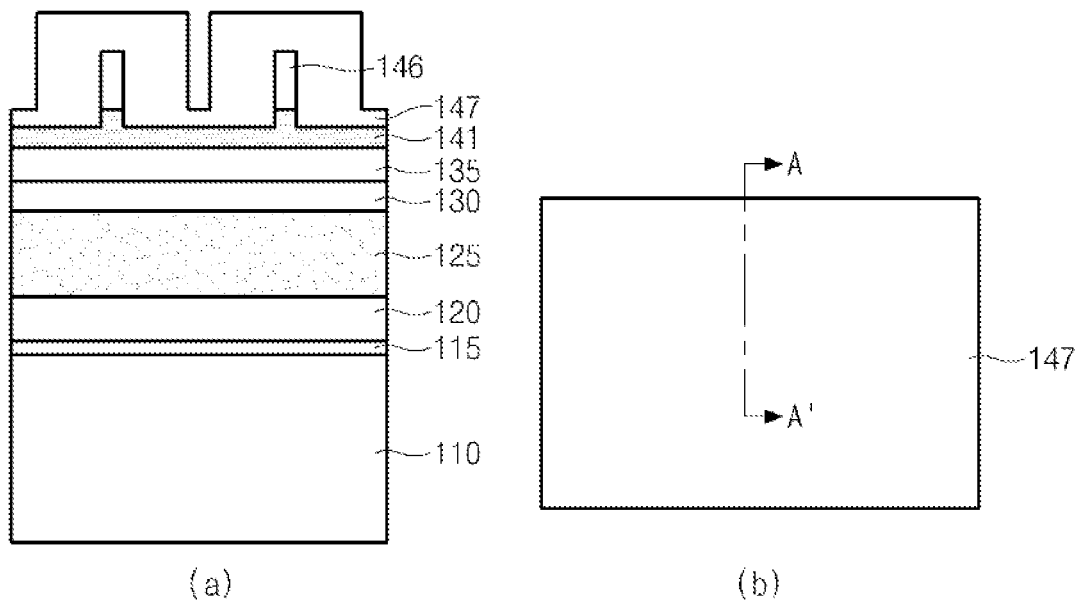

Referring to FIG. 5D, the spacer oxide layer 147 is formed on the second polysilicon pattern 146 and the PE-TEOS pattern 141 in a predetermined thickness. In an embodiment, the spacer oxide layer 147 may be formed so that a space between the spacer oxide layer 147 on the second polysilicon patterns 146 becomes has the same width of the polysilicon pattern 146 (that is, for example, 16 nm in an embodiment applying the above-described conditions).

Figure 5E:
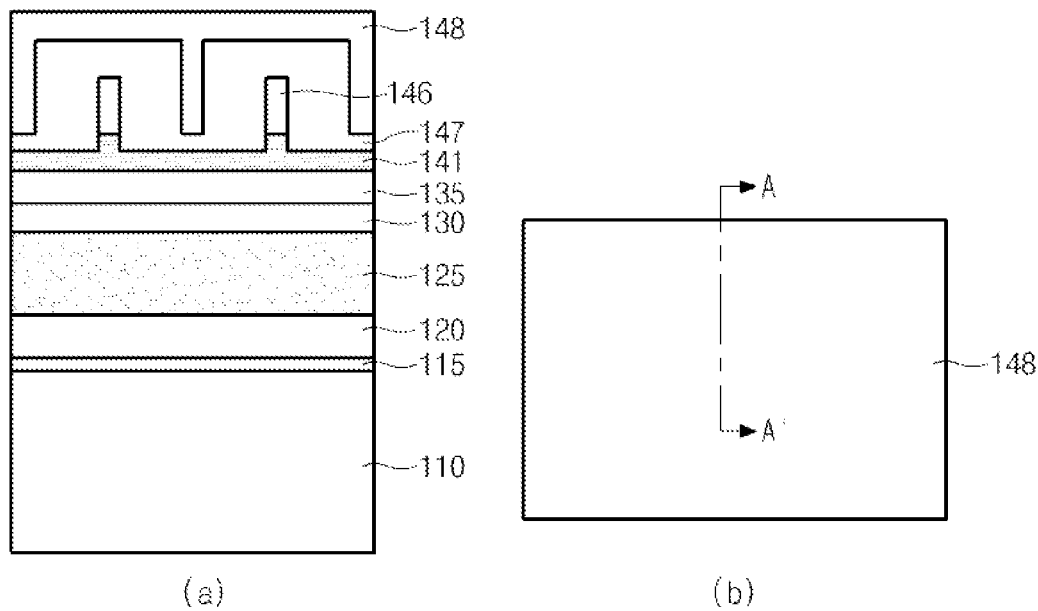

Referring to FIG. 5E, a gap-fill layer 148 is formed in the space between the second polysilicon patterns 146. The gap-fill layer 148 may include the same material as the second polysilicon pattern 146, that is, polysilicon. Thus the gap-fill layer 148 is formed to cover an entire surface of the semiconductor substrate.

Figure 5F:
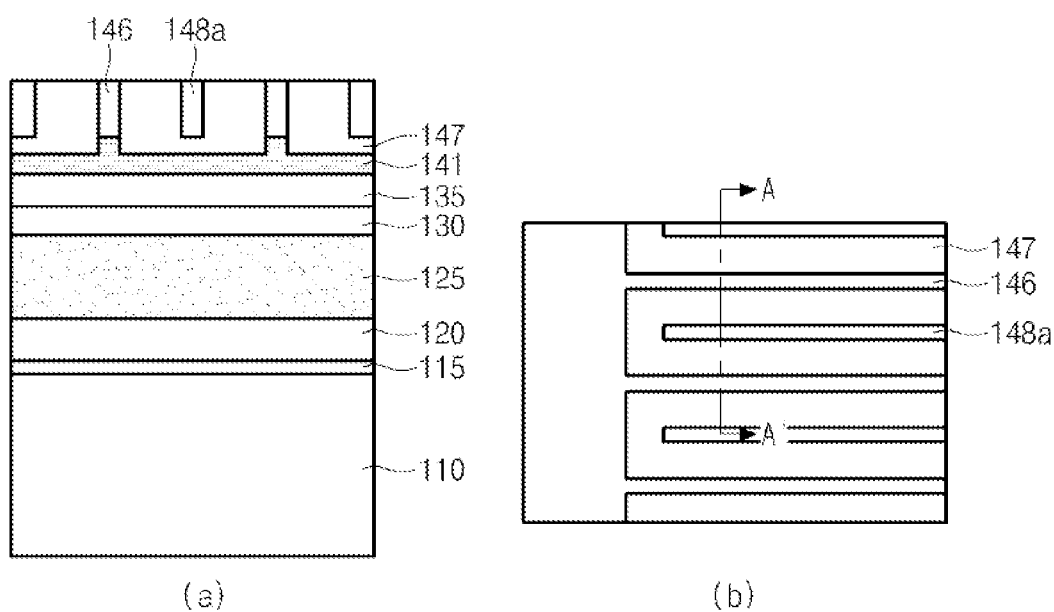

Referring to FIG. 5F, an etch back process or a CMP process is performed on the gap-fill layer 148 and the spacer oxide layer 147, with an upper surface of the second polysilicon pattern 146 as an etching target, to remove the spacer oxide layer 147 and the gap-fill layer 148. The upper surface of the second polysilicon pattern 146 is exposed and simultaneously a gap-fill layer pattern 148a is formed. In an embodiment, a portion of the spacer oxide layer 147 remains below the gap-fill layer pattern 148a. As a result, a stacked structure in which the spacer oxide layer 147 remains blow the gap-fill layer pattern 148a and a stacked structure in which the PE-TEOS pattern 141 remains below the second polysilicon pattern 146 are formed.

Figure 5G:
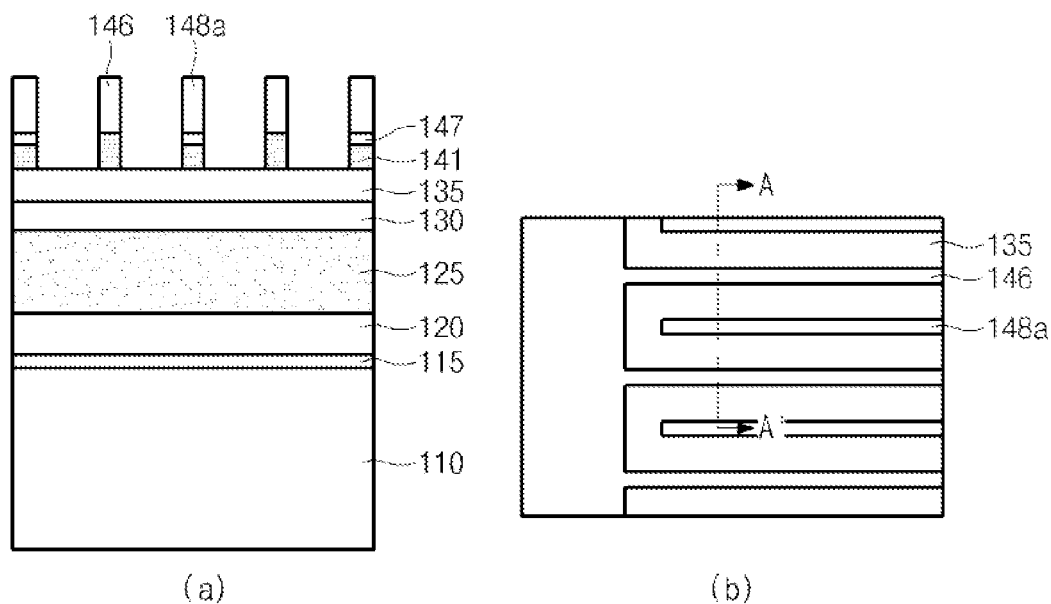

Referring to FIG. 5G, the spacer oxide layer 147 between the second polysilicon pattern 146 and the gap-fill layer pattern 148a are removed to form a line and space pattern in which one additional pattern is further formed compared with the initial photoresist layer patterns 160 shown in FIG. 5A. At this time, the PE-TEOS pattern 141 having the similar etch selectivity as the spacer oxide layer 147 between the second polysilicon pattern 146 and the gap-fill layer pattern 148a is also removed so that only the PE-TEOS patterns 141 below the second polysilicon pattern 146 and the gap-fill layer pattern 148a remains.

The processes illustrated in FIGS. 5A to 5G correspond to (1) first Negative SPT process in a 4 Negative SPT/Negative SPT scheme according to the second exemplary embodiment. Hereinafter, a (2) second Negative SPT process will be described.

Figure 5H:
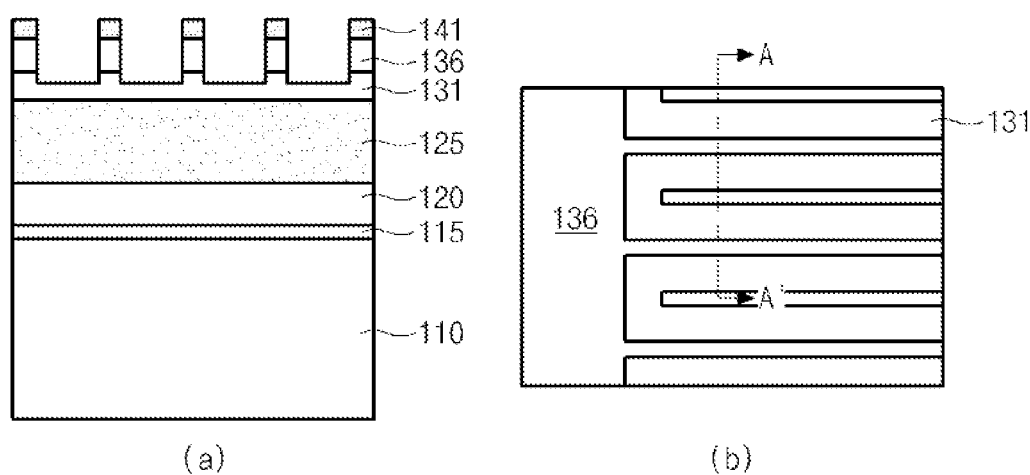

Referring to FIG. 5H, the underlying first polysilicon layer 135 is etched using the PE-TEOS pattern 141 formed in FIG. 5G as an etch mask to form a first polysilicon pattern 136 and then the first silicon oxynitride layer 130 is partially etched to a predetermined thickness to form a first silicon oxynitride layer pattern 131. In the process of etching the first polysilicon layer 135, the second polysilicon pattern 146 and the gap-fill layer pattern 148a formed of polysilicon on the PE-TEOS pattern 141 may be removed. PE-TEOS layer 141 has a similar etch selectivity to that of a spacer oxide layer (see 147 of FIG. 5I) that will be formed later below the second polysilicon pattern 146 and the gap-fill layer pattern 148a. A wet strip process may be performed using a HF-based material to remove the remaining oxide layer after the first silicon oxynitride layer 131 is etched.

Figure 5I:
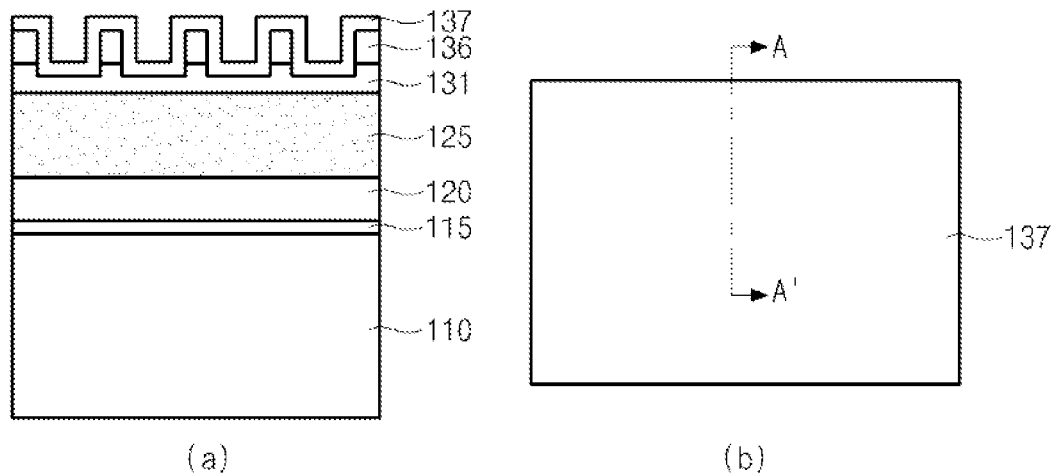

Referring to FIG. 5I, a spacer oxide layer 137 is formed on the first polysilicon pattern 136 and the first oxynitride layer pattern 131 to a predetermined thickness. In an embodiment, a space between the spacer oxide layer 137 may have the same width (16 nm, for example, in an embodiment applying the above-described conditions) as that of the first polysilicon pattern 136.

Figure 5J:
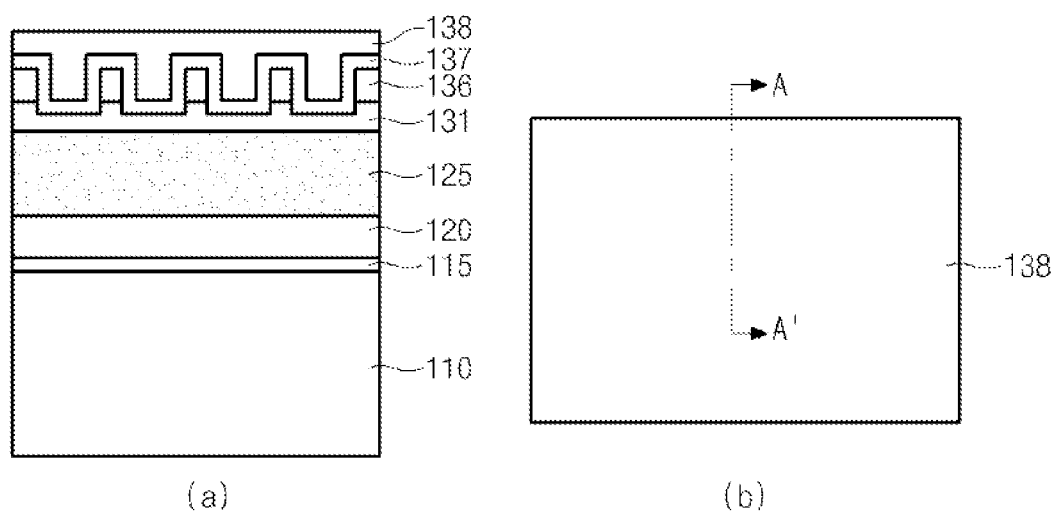

Referring to FIG. 5J, a gap-fill layer 138 is formed on the spacer oxide layer 137 to fill the space between the spacer oxide layer 137. The gap-fill layer 138 may include the same material as the first polysilicon pattern 136, that is, polysilicon.

Figure 5K:
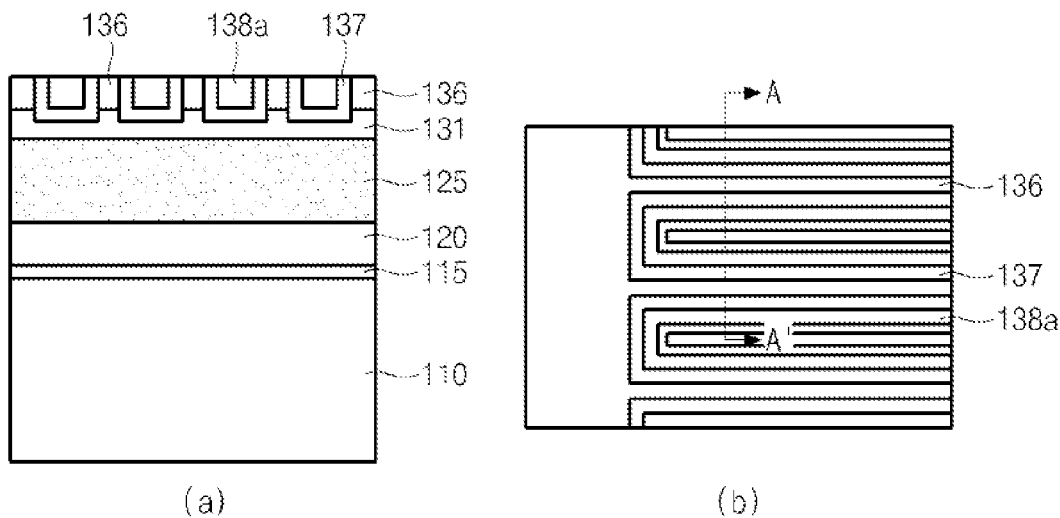

Referring to FIG. 5K, an etch back process is performed on the gap-fill layer 138 and the spacer oxide layer 137 with an upper surface of the first polysilicon pattern 136 as an etching target so that the upper surface of the first polysilicon pattern 136 is exposed and simultaneously a gap-fill layer pattern 138a is formed. In an embodiment, the spacer oxide layer 137 remains below the gap-fill layer pattern 138a to form a stacked structure of the gap-fill layer pattern 138a and the spacer oxide layer 137 provided below the gap-fill layer pattern 138a. This stacked structure may have the same thickness as a stacked structure of the first silicon oxynitride layer pattern 131 and the first polysilicon pattern 136. It is desirable that a top of the first silicon oxynitride layer pattern 131 provided below the first polysilicon pattern 136 is level with a top of the spacer oxide layer 137.

Figure 5L:
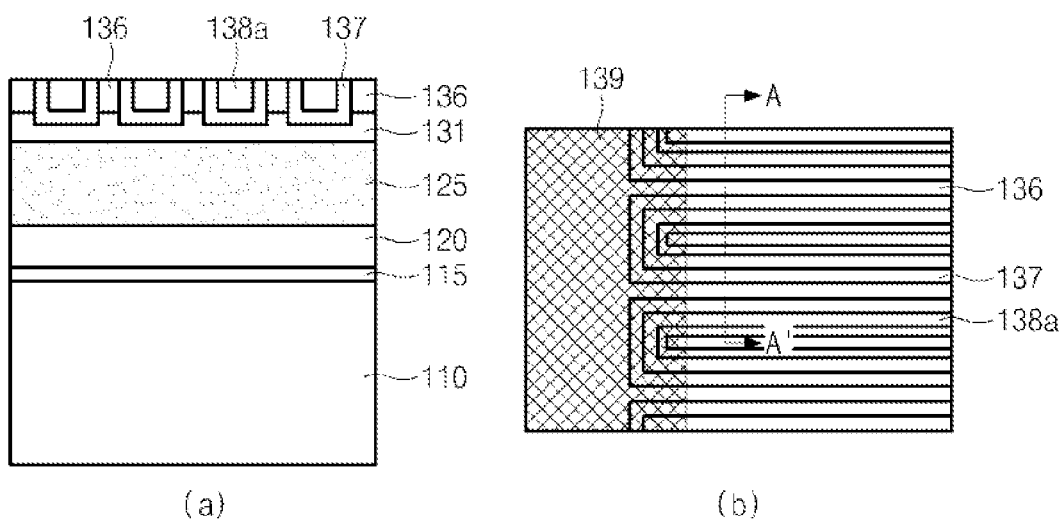

Referring to FIG. 5L, a pad mask 139 is formed over the peripheral circuit area and a first side of the cell area which is adjacent to the peripheral circuit area. The pad mask 139 may serve as a protection layer which prevents the gap-fill pattern 138a in the peripheral circuit area from being etched in a subsequent process.

Figure 5M:
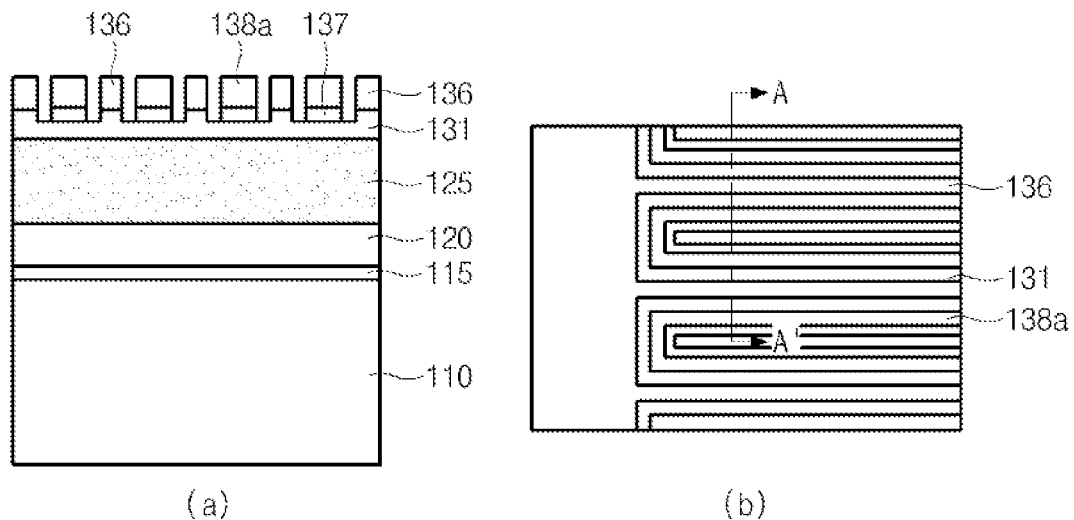

Referring to FIG. 5M, the spacer oxide layer 137 between the polysilicon pattern 136 and the gap-fill pattern 138a is removed through an etching process. Subsequently, the pad oxide layer 139 is removed and then a cleaning process is performed.

Figure 5N:
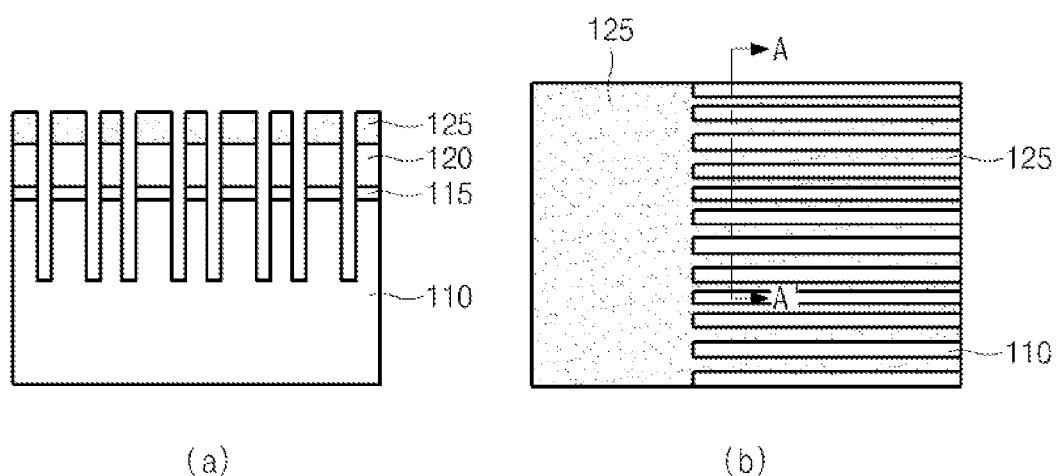
Figure 50:
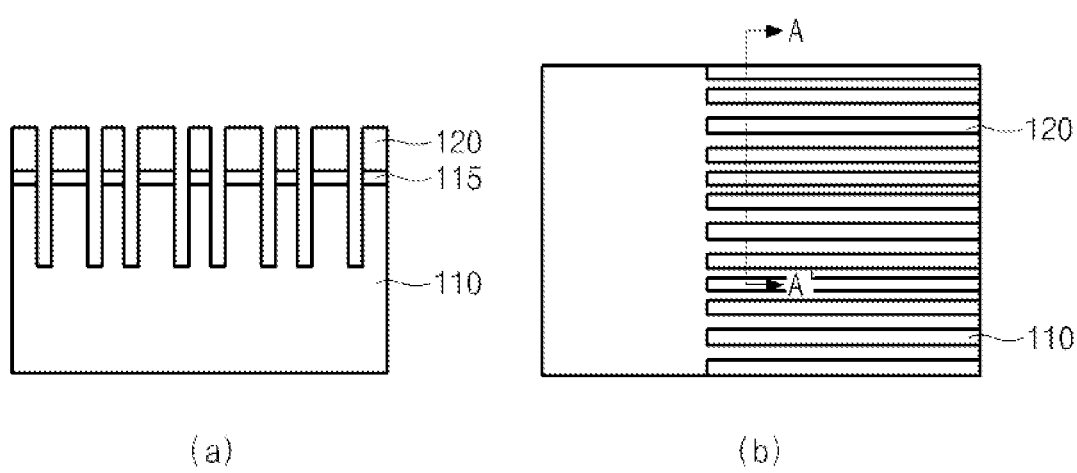

Referring to FIG. 5N, a pad mask (not shown) opening the peripheral circuit area and the first side of the cell area is formed. That is, the pad mask opens a region in which the pad mask 139 was formed. The gap-fill pattern 138a, the spacer oxide layer 137, and the first silicon oxynitride layer pattern 131 are etched using the pad mask to cut U-shaped patterns formed by the SPT process.

The pad mask (not shown) opening the peripheral circuit area and the first side of the cell area is removed, a pad mask (not shown) opening the U-shaped patterns is formed. Next, the underlying layers, that is, the first oxynitride layer pattern 131, the first amorphous carbon layer 125, the pad nitride layer 120, the pad oxide layer 115, and the layer to be etched 110 are sequentially etched using the polysilicon pattern 136 and the gap-fill layer pattern 138*a* as an etch mask. The first amorphous carbon layer 125 is used as a final hard mask. This is because the amorphous carbon layer 125 is a material capable of simultaneously etching silicon of the active region and oxide of the isolation layer and protecting a hard mask nitride layer (not shown) of the buried gate.

Then referring to FIG. 5O, the amorphous carbon layer 125 is removed.

In the method of forming a fine pattern of a semiconductor device according to the above-described second exemplary embodiment, the double SPT process, including a positive SPT process and a negative SPT process is applied to implement line and space patterns having a uniform fine linewidth.

According to the methods of forming a fine pattern in a semiconductor device according to the exemplary embodiments, a double SPT including Negative SPT is applied so that a line/space pattern having a fine uniform line width can be implemented.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A method of forming a fine pattern of a semiconductor device, the method comprising:
   forming a second layer over a first layer;
   forming a partition pattern over the second layer;
   forming first spacers over sidewalls of the partition pattern;
   forming a first gap-fill layer filling between the first spacers;
   removing the first spacers;
   etching the second layer using the partition pattern and the first gap-fill layer as an etch mask to form a first pattern;
   forming second spacers over sidewalls of the first pattern;
   forming a second gap-fill layer filling between the second spacers;
   removing the second spacers; and
   etching the first layer using the first pattern and the second gap-fill layer as an etch mask to form a second pattern,
   wherein the first layer and the second gap-fill layer are formed of the same material.

2. The method of claim 1, wherein the forming the partition pattern includes:
   forming a hard mask layer over the second layer;
   forming a photoresist pattern over the hard mask layer; and
   etching the hard mask layer using the photoresist pattern as an etch mask.

3. The method of claim 2, wherein the photoresist pattern has a line-to-space width ratio of 1:7.

4. The method of claim 3, wherein a width of the space of the photoresist pattern is four times larger than a width of the second pattern.

5. The method of claim 1, wherein the first spacers are formed so that a width between the first spacers is substantially the same as a width of the partition pattern.

6. The method of claim 1, wherein the partition pattern and the first gap-fill layer are formed of the same material.

7. The method of claim 1, wherein the partition pattern, the first gap-fill layer, the first layer, and the second gap-fill layer are formed of the same material.

8. The method of claim 1, wherein the forming the second pattern includes cutting a U-shaped edge of the first pattern to form the first pattern in a line shape.

\* \* \* \* \*